United States Patent [19]
DaSilva

[11] Patent Number: 5,105,168
[45] Date of Patent: Apr. 14, 1992

[54] VECTOR LOCKED LOOP

[75] Inventor: Marcus K. DaSilva, Spokane, Wash.

[73] Assignee: Hewlett-Packard Company, Palo Alto, Calif.

[21] Appl. No.: 751,458

[22] Filed: Aug. 28, 1991

[51] Int. Cl.$^5$ ............................................. H03L 7/00
[52] U.S. Cl. ......................................... 331/2; 331/25; 332/145; 332/151; 328/155
[58] Field of Search ............... 331/2, 17, 25; 332/144, 332/145, 149, 151; 328/155, 135, 175

[56] References Cited

U.S. PATENT DOCUMENTS 3,778,728 12/1973 Schaefer .......................... 328/155 X
4,884,040 11/1989 Fling .................................. 331/17 X

OTHER PUBLICATIONS

Senderowicz, Daniel, "An NMOS Integrated Vector Lock Loop," Ph.D. Dissertation, University of California, Berkeley, 1982, 148 pages.
Senderowicz et al., "An NMOS Integrated Vector-Locked Loop", U. of C., Berkeley, IEEE International Symposium on Circuits and Systems, 1982, vol. III, pp. 1164–1167.
Say, Sabit, "Vector-Locked Loop Interference Canceller", Ph.D. Dissertation, Polytechnic Institute of New York, 1985, 197 pages.

Primary Examiner—Robert J. Pascal

[57] ABSTRACT

A vector locked loop is disclosed having a topology somewhat similar to two cross coupled phase locked loops, but wherein both magnitude and phase are used as feedback signals. The output signal is generated by combining the outputs of two VCOs in a combiner network. This output signal is fed back to the input, where phase and magnitude detectors are used to generate error signals. These error signals are processed to yield control signals for controlling the frequencies of the two VCOs. The vector locked loop can be adapted for a number of applications, including frequency translation, modulation (phase, amplitude or arbitrary), and high efficiency linear power amplification.

18 Claims, 3 Drawing Sheets 5,105,168

VECTOR LOCKED LOOP

FIELD OF THE INVENTION

The present invention relates to signal sources, and more particularly relates to signal sources that employ a feedback loop to lock both the phase and amplitude of the resultant output signal.

BACKGROUND AND SUMMARY OF THE INVENTION

The concept of feedback signal generators that are both phase- and amplitude-locked was first expounded by Daniel Senderowicz in his 1982 PhD dissertation at U.C. Berkeley, "An NMOS Integrated Vector Lock Loop." An abbreviated form of this work was published by the IEEE in the Proceedings of the 1982 International Symposium on Circuits and Systems, volume 3, pp. 1164–1167.

In the decade since the Senderowicz publications, the vector locked loop has failed to gain widespread acceptance. Indeed, with the exception of a second PhD dissertation (Say, "Vector-Locked Loop Interference Canceller," Polytechnic Institute of New York, 1985), the published literature seems devoid of any subsequent mention of the technology The particular circuit topology taught by the Senderowicz publications, while advantageous in some respects, limits the circuit's utility and is believed to have contributed to the vector locked loop's lack of widespread acceptance In accordance with the present invention, a more versatile topology is disclosed by which the utility of the VLL is increased and the range of applications in which the circuit may be advantageously employed is expanded.

As an aid in understanding the circuit topology of the present invention, it will be helpful to first detail certain of its mathematical underpinnings.

A vector modulated carrier may be expressed as:

$$V(t) = A(t)\cos\,[\omega t + \phi(t)] \tag{1}$$

where A(t) represents the amplitude modulation function and $\phi(t)$ represents the phase modulation.

Using complex notation the above expression becomes $$V(t) = A(t)e^{j\phi(t)}e^{j\omega t} \tag{2}$$

It is often useful to think of a vector modulated signal in terms of a sum of real and imaginary components:

$$V(t) = [I(t) + jQ(t)]e^{j\omega t} \tag{3}$$

where:

$$I(t) = A(t)\cos\,[\phi(t)] \tag{4}$$

and $$Q(t) = A(t)\sin\,[\phi(t)] \tag{5}$$

A vector modulated signal can be expressed graphically as shown in FIG. 1. A vector with amplitude A(t) and angle $\phi(t)$ is shown to be the sum of two orthogonal vectors I(t) and Q(t). The I-Q method is often used to generate vector modulated signals. Two signals with a phase difference of 90 degrees are generated. Their amplitudes are modulated with I(t) and Q(t) respectively. The two modulated signals are then added together to form the final signal Another way of representing a vector modulated signal is to express it as the sum of two signals of equal amplitude, but with arbitrary phase. For simplicity, the signals may be assumed to be of unit amplitude The signal $$V(t) = A(t)\cos\,[\omega t + \phi(t)] \tag{6}$$

can be expressed as $$V(t) = \cos\,[\omega t + \phi 1(t)] + \cos\,[\omega t + \phi 2(t)] \tag{7}$$

or $$V(t) = [e^{j\phi 1(t)} + e^{j\phi 2(t)}]e^{j\omega t} \tag{8}$$

It can be shown that $\phi 1(t)$ and $\phi 2(t)$ are related to the amplitude and phase of the signal as:

$$\phi 1(t) = \phi(t) + \cos^{-1}[A(t)] \tag{9}$$

and $$\phi 2(t) = \phi(t) - \cos^{-1}[A(t)] \tag{10}$$

The reverse relationships are:

$$\phi(t) = [\phi 1(t) = \phi 2(t)]/2 \tag{11}$$

and $$A(t) = 2\cos\{[\phi 1(t) - \phi 2(t)]/2\} \tag{12}$$

FIG. 2 demonstrates that an arbitrary vector with length A(t) and angle $\phi(t)$ can be represented as the sum of two vectors of equal length and phases $\phi 1(t)$ and $\phi 2(t)$. The length, A(t), of the resultant vector must be less than twice the length of the component vectors. If the two vectors have unit amplitude as in FIG. 2, then:

$$A(t) \leq 2 \tag{13}$$

Again, assuming component vectors of unit length, if the resultant vector has a length of 2, then $\phi 1(t)$ is equal to $\phi 2(t)$. If A(t) is reduced, the two component vectors move apart.

With the foregoing by way of background, it can be seen that a modulation signal of arbitrary magnitude and phase can be produced by combining two signals and controlling their phases in a controlled manner. It is on this principle that the vector locked loop circuit topology of the present invention is based The features and advantages of the present invention will be more readily apparent from the following Detailed Description thereof, which proceeds with reference to the accompanying drawings.

DETAILED DESCRIPTION

Figure 1:
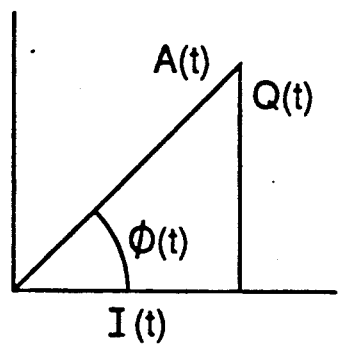
FIG. 1 is a diagram showing the graphical illustration of a vector modulated signal.
Figure 2:
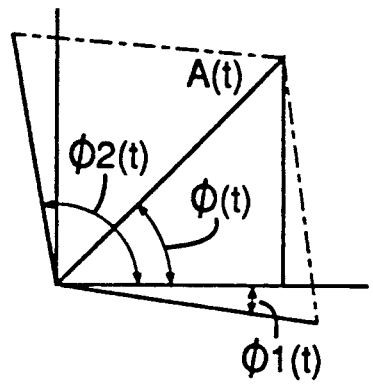
FIG. 2 is a diagram illustrating that an arbitrary vector can be decomposed into two vectors of equal magnitude.
Figure 3:
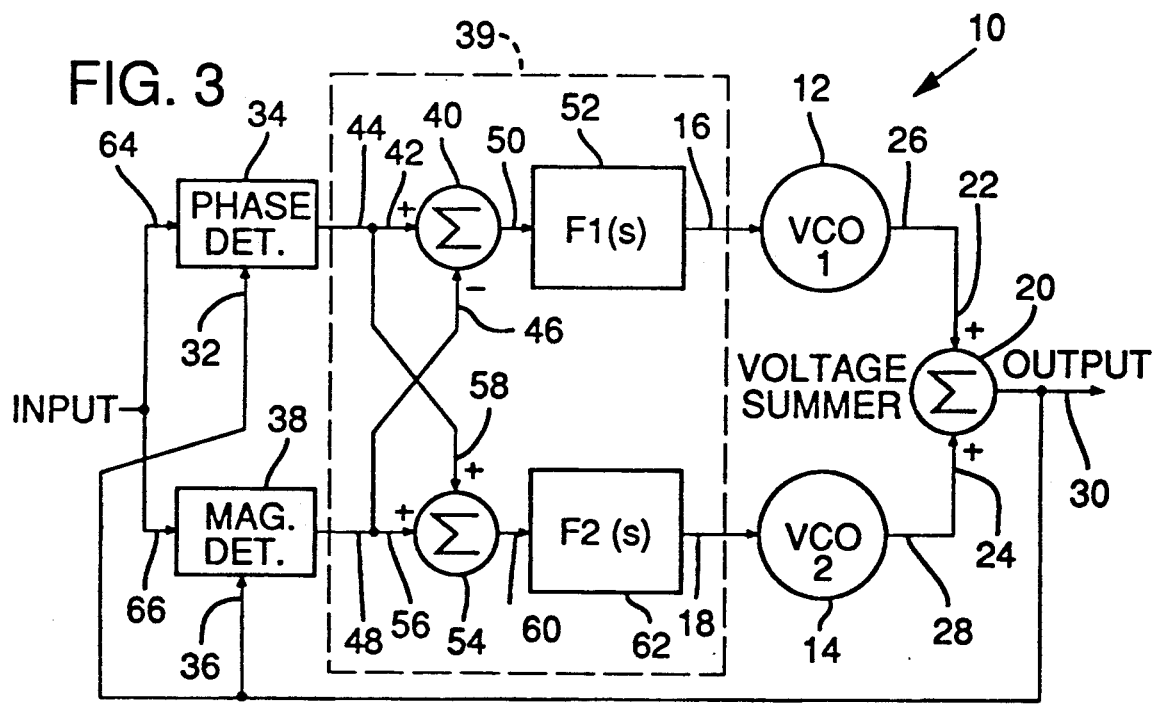
FIG. 3 is a block diagram of a vector locked loop according to one embodiment of the present invention.
Figure 4A:
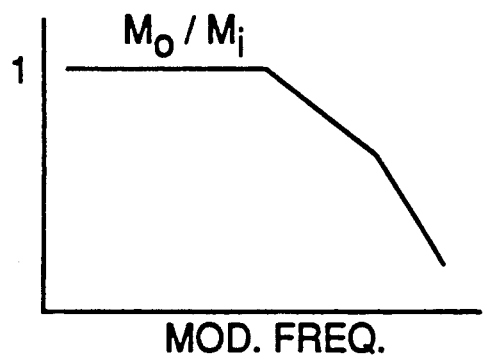
FIGS. 4A–4D are plots showing the frequency response of the vector locked loop transfer matrix elements.
Figure 4B:
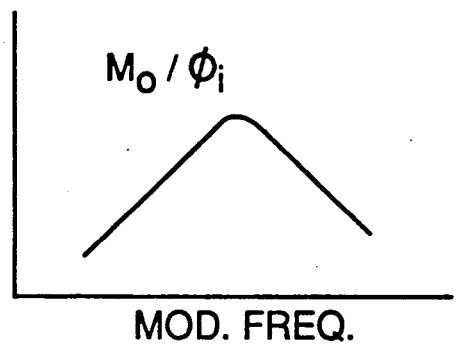
Figure 4C:
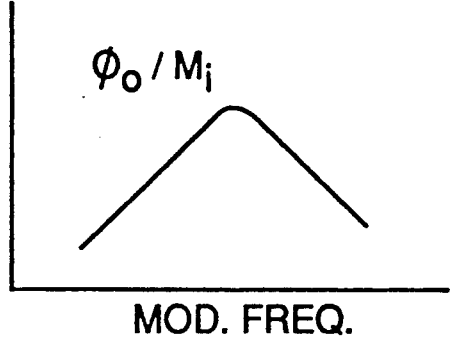
Figure 4D:
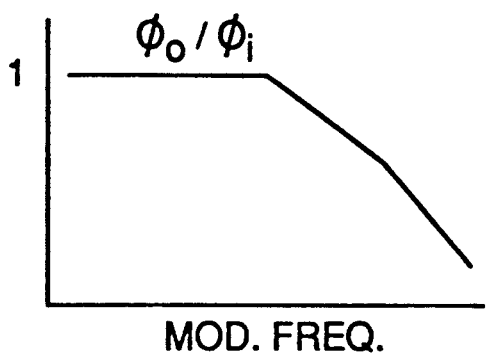

Referring to FIG. 3, the illustrated vector locked loop 10 includes first and second oscillators 12, 14, each of which produces an output signal whose frequency is responsive to a signal applied to control inputs 16, 18 thereof A combiner circuit 20 has inputs 22, 24 coupled to outputs 26, 28 of the first and second oscillators 12, 14, and an output 30 coupled to a first input 32 of a phase detector circuit 34 and first input 36 of a magnitude detector circuit 38. A difference circuit 40 has a first input 42 coupled to an output 44 of the phase detector 34, a second input 46 coupled to an output 48 of the magnitude detector 38, and an output 50 coupled to the control input 16 of the first oscillator 12 through a first loop filter 52. A summer circuit 54 has a first input 56 coupled to the output 48 of the magnitude detector 38, a second input 58 coupled to the output 44 of the phase detector 34, and an output 60 coupled to the control input 18 of the second oscillator 14 through a second loop filter 62. Each of the detector circuits 34, 38 also has a second input 64, 66 to which a reference signal can be applied.

In its operation, the illustrated vector locked loop 10 is somewhat similar to two cross coupled phase locked loops, where both magnitude and phase are used as feedback signals. The output signal is generated by combining the outputs of the two VCOs 12, 14 in the voltage combiner 20. This output signal is fed back to the input, where the phase and magnitude detectors 34, 38 are used to generate error signals. The difference between the phase error and the magnitude error is fed to the first VCO 12 through the first loop filter 52. The sum of the phase error and the magnitude error are fed to the second VCO 14 through the second loop filter 62.

When the loop is locked, the phase error and the magnitude error are driven to zero. The output signal will then track the phase, frequency, and amplitude of the input signal.

The operation of certain of the foregoing circuit elements is next examined in greater detail.

Phase detector 34

Operation of the phase detector 34 is characterized by the equation $$V_{out} = K_d(\phi_i - \phi_o) = K_d \phi_{err} \tag{14}$$

where $\phi_i$ and $\phi_o$ are phases of the input and output signals respectively.

Magnitude detector 38

Operation of the magnitude detector 38 is characterized by the equation $$V_{out} = K_m(M_i - M_o) = K_m M_{err} \tag{15}$$

where $M_i$ and $M_o$ are the magnitudes of the input and output signals respectively.

Loop filters 52, 62

Elements 52, 62 represent arbitrary loop filter blocks. These blocks can be used to tailor the dynamics of the VLL, affecting bandwidth, acquisition time, etc. They are treated in the following discussion as arbitrary transfer functions $F_1(S)$ and $F_2(S)$.

Oscillators 12, 14

Operation of each of the oscillators (here voltage controlled oscillators) is characterized by the equations $$\dot\phi_1 = K_{v1} V_{in} \tag{16}$$

$$\phi_1(s) = K_{v1} V_{in}/S \tag{17}$$

and $$\omega_2 = K_{v2} V_{in} \tag{18}$$

$$\phi_2(s) = K_{v2} V_{in}/s \tag{19}$$

Kv1 and Kv2 are the voltage to frequency conversion constants of the two VCO's.

The phases at the outputs of the VCO's can be expressed in matrix form as a function of the signals at the input to the loop filters:

$$\begin{bmatrix} \phi_1 \\ \phi_2 \end{bmatrix} = \begin{bmatrix} K_{v1} F_1(S)/S & 0 \\ 0 & K_{v2} F_2(S)/S \end{bmatrix} \begin{bmatrix} b_1 \\ b_2 \end{bmatrix} \tag{20}$$

Combiner 20

For the sake of simplicity, the outputs of the two VCO's are assumed to be of unit amplitude. The signal at the output of the combiner 20 depends on the phases of the two VCO's.

$$\phi_o = (\phi_1 + \phi_2)/2 \tag{21}$$

$$M_o = 2\cos[(\phi_1 - \phi_2)/2] \tag{22}$$

The expression for the output magnitude can be linearized by taking partial derivatives of $M_o$ with respect to $\phi_1$ and $\phi_2$.

$$\frac{\delta M_o}{\delta \phi_1} = -\sin[(\phi_1 - \phi_2)/2] = -[1 - M_o^2/4]^{\frac{1}{2}} = -A \tag{23}$$

$$\frac{\delta M_o}{\delta \phi_2} = \sin[(\phi_1 - \phi_2)/2] = [1 - M_o^2/4]^{\frac{1}{2}} = A \tag{24}$$

For values of $M_o << 2$, $A = 1$

The combiner 20 can then be represented by a matrix:

$$\begin{bmatrix} M_o \\ \phi_o \end{bmatrix} = \begin{bmatrix} -A & A \\ 1/2 & 1/2 \end{bmatrix} \begin{bmatrix} \phi_1 \\ \phi_2 \end{bmatrix} \tag{25}$$

Difference circuit 40/Summer circuit 54

The signals at the input to the loop filters 52, 62 are:

$$b1 = K_d \phi_{err} - K_m M_{err} \tag{26}$$

and $$b2 = k_d \phi_{err} + K_m M_{err} \tag{27}$$

These can be expressed in matrix form as:

$$\begin{bmatrix} b1 \\ b2 \end{bmatrix} = \begin{bmatrix} -K_m & K_d \\ K_m & K_d \end{bmatrix} \begin{bmatrix} M_i - M_o \\ \phi_i - \phi_o \end{bmatrix} \tag{28}$$

Transfer matrix:

$$\begin{bmatrix} M_o \\ \phi_o \end{bmatrix} = \tag{29}$$

$$\begin{bmatrix} -A & A \\ 1/2 & 1/2 \end{bmatrix} \begin{bmatrix} K_{v1}F_1(S)/S & 0 \\ 0 & K_{v2}F_2(S)/S \end{bmatrix} \begin{bmatrix} -K_m & K_d \\ K_m & K_d \end{bmatrix} \begin{bmatrix} M_i - M_o \\ \phi_i - \phi_o \end{bmatrix}$$

or, $$\begin{bmatrix} M_o \\ \phi_o \end{bmatrix} = [G(S)] \begin{bmatrix} M_i - M_o \\ \phi_i - \phi \end{bmatrix} \tag{30}$$

G(S), when expanded, becomes;

$$\begin{bmatrix} A K_m/S[K_{v1}F_1(S) + K_{v2}F_2(S)] & A K_d/S[K_{v2}F_2(S) - K_{v1}F_1(S)] \\ K_m/2S[K_{v2}F_2(S) - K_{v1}F_1(S)] & K_d/2S[K_{v1}F_1(S) + K_{v2}F_2(S)] \end{bmatrix} \tag{31}$$

The feedback equation in matrix form can be written as:

$$V_o = [I + G(S)]^{-1}G(S)V_i \tag{32}$$

where I is the identity matrix, and $V_o$ and $V_i$ are the input and output vectors respectively.
Solving the above matrix equation yields:

$$\begin{bmatrix} M_o \\ \phi_o \end{bmatrix} = \begin{bmatrix} t_{11} & t_{12} \\ t_{21} & t_{22} \end{bmatrix} \begin{bmatrix} M_i \\ \phi_i \end{bmatrix} \tag{33}$$

where $$t_{11} = \frac{SAK[K_{v1}F_1(S) + K_{v2}F_2(S)] + 2AK_dKK_{v1}K_{v2}F_1(S)F_2(S)}{S^2 + S(AK_m + K_d/2)[F_1(S)K_{v1} + F_2(S)K_{v2}] + 2AK_mK_dK_{v1}K_{v2}F_1(S)F_2(S)} \tag{34}$$

$$t_{12} = \frac{SAK_d[K_{v2}F_2(S) - K_{v1}F_1(S)]}{S^2 + S(AK_m + K_d/2)[F_1(S)K_{v1} + F_2(S)K_{v2}] + 2AK_mK_dK_{v1}K_{v2}F_1(S)F_2(S)} \tag{35}$$

$$t_{21} = \frac{SK/2[K_{v2}F_2(S) - K_{v1}F_1(S)]}{S^2 + S(AK_m + K_d/2)[F_1(S)K_{v1} + F_2(S)K_{v2}] + 2AK_mK_dK_{v1}K_{v2}F_1(S)F_2(S)} \tag{36}$$

$$t_{22} = \frac{SK_d/2[K_{v1}F_1(S) + K_{v2}F_2(S)] + 2AK_dKK_{v1}K_{v2}F_1(S)F_2(S)}{S^2 + S(AK_m + K_d/2)[F_1(S)K_{v1} + F_2(S)K_{v2}] + 2AK_mK_dK_{v1}K_{v2}F_1(S)F_2(S)} \tag{37}$$

It is instructive to note that if $F_2(S)K_{v2} = F_1(S)K_{v1}$, the two paths are balanced and the cross terms $t_{12}$ and $t_{21}$ are zero. This means that the output magnitude is only dependent on the input magnitude, and the output phase is only dependent on the input phase. Even if perfect balance is not achieved, a good balance is desireable because it minimizes the effects of magnitude on phase and phase on magnitude.

It should also be noted that the dependencies of output magnitude on input magnitude, and of output phase on input phase, are low-pass functions while the dependencies of output phase on input magnitude, and of output magnitude on input phase, are band-pass functions. The maximum gain of the bandpass function becomes zero if the two paths in the loops are perfectly matched. At low modulation frequencies, the output phase will be equal to the input phase and the output magnitude will be equal to the input magnitude. These relationships are shown in the graphs of FIGS. 4A-4D.

The fact that the phase and amplitude of the output are equal to the phase and amplitude of the input makes the VLL useful in a variety of applications, a few of which are detailed below.

Figure 5:
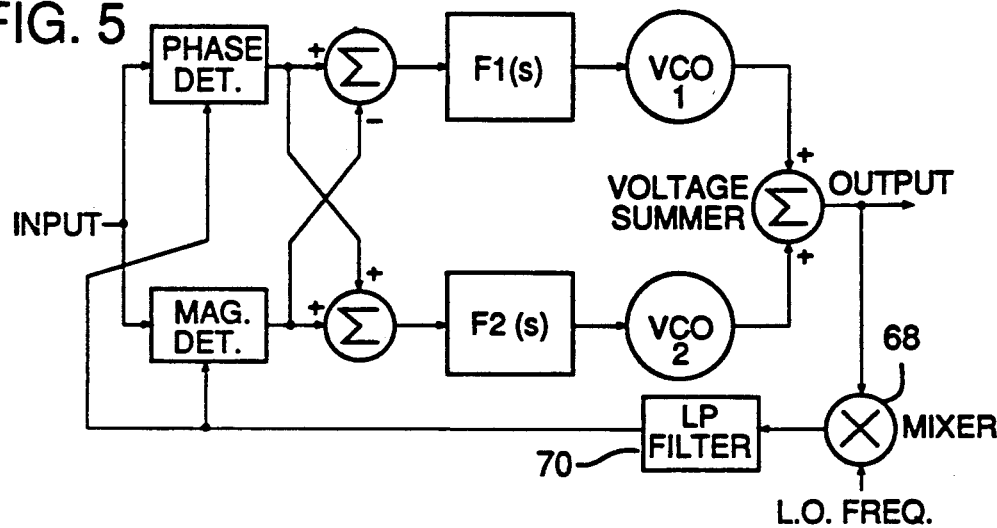
FIG. 5 is a block diagram of the vector locked loop of FIG. 3 adapted for frequency translation.
Figure 6:
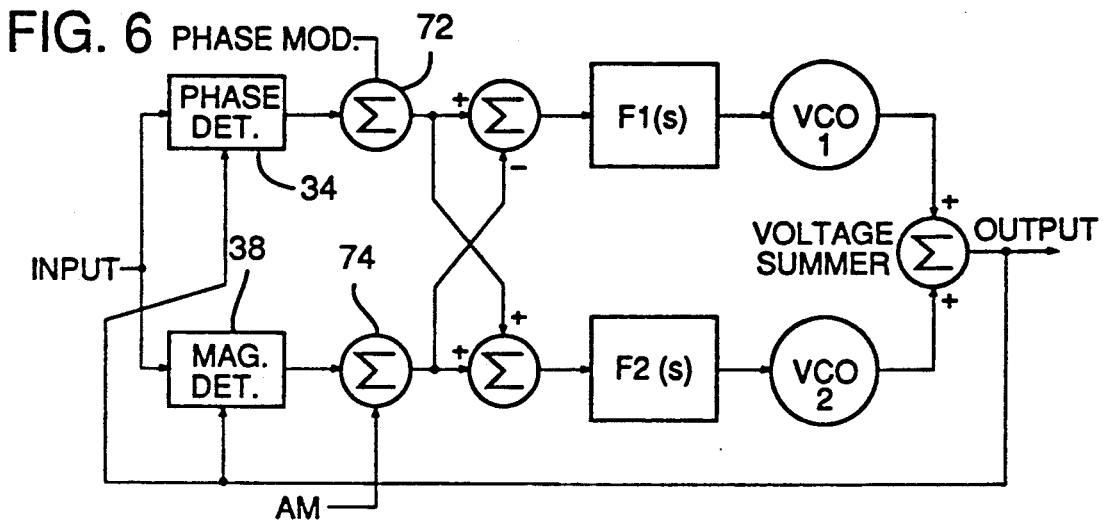
FIG. 6 is a block diagram of the vector locked loop of FIG. 3 adapted for amplitude and/or phase modulation.

A first exemplary application of the VLL is as a frequency translator, such as may be used to up-convert low frequency signals that have arbitrary (i.e. vector) modulation. Referring to FIG. 5, the output of the VLL is applied to a mixer 68, to which a local oscillator signal is also applied. A low-pas filter 70 is used to eliminate any unwanted mixer products. The output of the filter 70 is then compared with the input signal, generating amplitude and phase error signals as before. When locked, the frequency of the VLL output signal will be the sum of that of the local oscillator signal and the input signal. Any modulation present in the input signal will also be present in the output signal.

A second exemplary application of the illustrated VLL is as a phase and/or amplitude (i.e. vector) modulator. The modulation signal is first decomposed into a phase component and an amplitude component. The phase component is added to the phase error by a summer circuit 72 after the phase detector 34. The amplitude component is added to the magnitude error by a summer circuit 74 at the output of the magnitude detector 38. The frequency of the output signal will be equal to that of the input signal, but it will be modulated in accordance with the AM and phase modulation inputs.

A third exemplary application of the illustrated VLL is as a RF power amplifier.

Signals with arbitrary modulation require linear amplifiers to maintain signal fidelity. Linear amplification is undesirable, however, due to the very low efficiencies of linear amplifier circuits. The VLL can be used to achieve linear amplification of bandpass signals while utilizing only non-linear power amplifiers.

Figure 7:
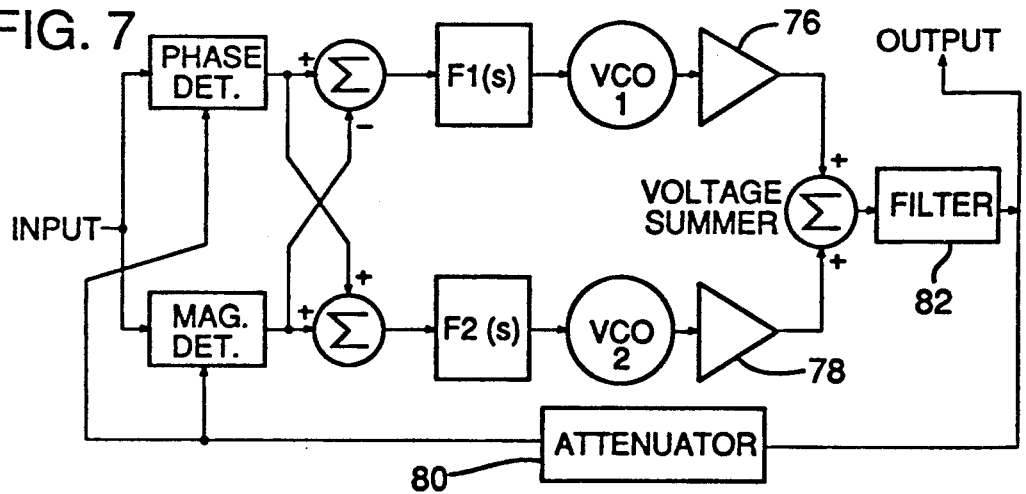
FIG. 7 is a block diagram of the vector locked loop of FIG. 3 employing class C amplifier stages.

Referring to FIG. 7, the output of each VCO 12, 14 is fed to an identical non-linear power amplifier 76, 78. The outputs of the power amplifiers are then added together in the combiner 20. The output of the combiner is sent to the load (typically an antenna) of the amplifier through a filter 82 that suppresses undesired spectral components. A portion of the signal is then attenuated by an attenuator 80 and compared to the input signal, thereby generating both a phase error and an amplitude error. Again, both of these errors are nulled. The output then is an accurate reproduction of the input signal. The gain of the system is the reciprocal of the attenuation.

Having described and illustrated the principles of my invention with reference to an illustrative embodiment, it will be recognized that the invention can be modified in arrangement and detail without departing from such principles. For example, while the invention has been illustrated with reference to circuits employing voltage controlled oscillators, it will be recognized that the invention can be practiced with any other signal sources that are responsive to control signals. Similarly, while the invention has been illustrated with reference to a pair of summer/difference circuits that combine the output signals from the phase and magnitude detectors and control the VCOs therefrom, it will be recognized that a variety of other circuit blocks can be substituted for these elements. Such other circuit blocks may produce output control signals according to a variety of different matrix transfer functions from the phase error and magnitude error input signals, of which only a single illustrative matrix transfer function has been illustrated.

Still further, while the invention has been illustrated with reference to VCOs that provide equal-amplitude output signals, it will be recognized that this need not be the case. While VCOs with different output amplitudes cannot ordinarily be combined to provide an output signal of zero magnitude (since the requirement of equal and opposite cannot be met), this is a limitation that does not matter in certain embodiments of the invention. In yet other cases it is desirable to provide an equalization circuit between at least one of the VCO outputs and the combiner circuit so that the signal amplitudes can be precisely matched prior to combining.

In view of the many possible embodiments to which the principles of my invention may be put, it should be recognized that the detailed embodiment is illustrative only and should not be taken as limiting the scope of my invention. Rather, I claim as my invention all such embodiments as may come within the scope and spirit of the following claims and equivalents thereto.

I claim:

1. A circuit comprising:
   first and second oscillators, the frequency of each being responsive to a signal applied to a control input thereof;
   a combiner circuit having inputs coupled to outputs of the first and second oscillators;
   a phase detector and an amplitude detector, an output of the combiner being coupled to a first input of the phase detector and to a first input of the magnitude detector;
   a circuit block having a first input coupled to an output of the phase detector and a second input coupled to an output of the magnitude detector, the circuit block having first and second outputs coupled to the control inputs of the first and second oscillators, respectively, the signals provided by the circuit block on the first and second outputs being related to the signals provided to the circuit block on the first and second inputs according to a transfer matrix; and
   a circuit input terminal coupled to a second input of the phase detector and to a second input of the magnitude detector.

2. The circuit of claim 1 in which the circuit block comprises:
   a difference circuit having a first input coupled to an output of the phase detector, a second input coupled to an output of the magnitude detector, and an output coupled to the control input of the first oscillator; and
   a summer circuit having a first input coupled to the output of the magnitude detector, a second input coupled to the output of the phase detector, and an output coupled to the control input of the second oscillator.

3. The circuit of claim 1 which further comprises:
   a first loop filter serially coupled with the control input of the first oscillator; and
   a second loop filter serially coupled with the control input of the second oscillator.

4. The circuit of claim 1 which further includes a mixer having a first input coupled to the outpout of the combiner, a second input coupled to a source of local oscillator signals, and an output coupled to the first inputs of the phase and magnitude detectors.

5. The circuit of claim 1 which further includes a phase modulator circuit interposed between the phase detector output and the first input of the circuit block, the phase modulator circuit having a first input coupled to the output of the phase detector and having a second input coupled to a source of a phase modulation signal, the phase modulator circuit having an output coupled to the first input of the circuit block.

6. The circuit of claim 1 which further includes an amplitude modulator circuit interposed between the magnitude detector output and the second input of the circuit block, the amplitude modulator circuit having a first input coupled to the output of the magnitude detector and having a second input coupled to a source of an amplitude modulation signal, the amplitude modulator circuit having an output coupled to the second input of the circuit block.

7. The circuit of claim 1 which further includes first and second non-linear amplifiers interposed between the outputs of the first and second oscillators and the inputs of the combiner circuit, respectively.

8. The circuit of claim 7 which further includes an attenuator circuit interposed between the output of the combiner circuit and the inputs of the phase and magnitude detectors.

9. A method of signal generation comprising the steps:
   providing an input signal;
   generating first and second oscillator signals;
   combining the first and second oscillator signals to yield an output signal;
   comparing the phase and magnitude of the output signal with that of the input signal and producing phase and magnitude error signals corresponding thereto; and
   generating first and second oscillator control signals in response to the phase and magnitude error signals, and controlling the first and second oscillators in response to said control signals.

10. The method of claim 9 in which the combining step includes combining first and second oscillator signals of equal magnitudes.

11. The method of claim 9 which further comprises:
   generating a sum control signal from the phase and magnitude error signals and controlling the first oscillator signal in response thereto; and
   generating a difference control signal from the phase and magnitude error signals and controlling the second oscillator signal in response thereto.

12. The method of claim 11 which further includes filtering the sum and difference control signals prior to controlling the first and second oscillator signals therewith.

13. The method of claim 9 which further includes mixing the output signal with a local oscillator signal to generate a translated output signal, and using said translated output signal in producing the phase and magnitude error signals.

14. The method of claim 9 which further includes modulating the phase error signal to phase modulate the output signal.

15. The method of claim 14 which further includes modulating the magnitude error signal to vector modulate the output signal.

16. The method of claim 9 which further includes modulating the magnitude error signal to amplitude modulate the output signal.

17. The method of claim 9 which further includes non-linearly amplifying the first and second oscillator signals before combining to yield an output signal.

18. A method of generating an arbitrarily-modulated signal comprising the steps:
   providing an input carrier signal;
   generating first and second oscillator signals;
   combining the first and second oscillator signals to yield an output signal;
   comparing the phase and magnitude of the output signal with that of the input signal and producing phase and magnitude error signals corresponding thereto;
   generating phase and amplitude modulation signals corresponding to a desired vector modulation format;
   summing the phase modulation signal with the phase error signal to produce a summed phase error signal;
   summing the amplitude modulation signal with the magnitude error signal to produce a summed magnitude error signal;
   generating a difference control signal from the summed phase and magnitude error signals and controlling the first oscillator signal in response thereto; and
   generating a sum control signal from the summed phase and magnitude error signals and controlling the second oscillator signal in response thereto.

* * * * *

UNITED STATES PATENT AND TRADEMARK OFFICE
CERTIFICATE OF CORRECTION

PATENT NO. : 5,105,168

DATED : APRIL 14, 1992

INVENTOR(S) : Marcus K. DaSilva

It is certified that error appears in the above-identified patent and that said Letters Patent is hereby corrected as shown below:

Col. 2, l. 29 - delete "$\phi(t) = [\phi1(t) = \phi2(t)]/2$" and insert therefor -- $\phi(t) = [\phi1(t) + \phi2(t)]/2$ --; and Col. 4, l. 9 - delete "$\phi_1 = K_{v1}V_{in}$" and insert therefor -- $\omega_1 = K_{v1} V_{in}$ --.

Signed and Sealed this

Twenty-fifth Day of April, 1995

Attest:

BRUCE LEHMAN

Attesting Officer     Commissioner of Patents and Trademarks